(12) United States Patent
Chen et al.

(10) Patent No.: US 10,204,947 B2
(45) Date of Patent: Feb. 12, 2019

(54) COVER-GLASS-FREE ARRAY CAMERA WITH INDIVIDUALLY LIGHT-SHIELDED CAMERAS

(71) Applicant: OmniVision Technologies, Inc., Santa Clara, CA (US)

(72) Inventors: Teng-Sheng Chen, Hsinchu (TW); Jau-Jan Deng, Taipei (TW); Chia-Yang Chang, Sunnyvale, CA (US); Wei-Feng Lin, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/261,324

(22) Filed: Sep. 9, 2016

(65) Prior Publication Data

US 2018/0076246 A1    Mar. 15, 2018

(51) Int. Cl.
| | |
|---|---|
| *G02B 3/00* | (2006.01) |
| *H04N 5/247* | (2006.01) |
| *H04N 5/359* | (2011.01) |
| *H04N 5/374* | (2011.01) |
| *H01L 27/146* | (2006.01) |

(52) U.S. Cl.
CPC ...... *H01L 27/14623* (2013.01); *G02B 3/0056* (2013.01); *G02B 3/0068* (2013.01); *G02B 3/0075* (2013.01); *H01L 27/14625* (2013.01); *H01L 27/14643* (2013.01); *H01L 27/14685* (2013.01); *H01L 27/14689* (2013.01); *H04N 5/247* (2013.01); *H04N 5/359* (2013.01); *H04N 5/374* (2013.01)

(58) Field of Classification Search
CPC ............ B29D 11/00298; G02B 13/003; G02B 13/0035; G02B 13/004; G02B 13/0045; G02B 13/005; G02B 13/0085; G02B 3/0006; G02B 3/0062; G02B 5/20; G02B 7/003; G02B 9/04; G03B 17/12; H04N 5/2257
USPC ....... 348/E5.031, 164, 222.1, 280, 302, 345; 359/621, 784
See application file for complete search history.

(56) References Cited

U.S. PATENT DOCUMENTS

| | | | | |
|---|---|---|---|---|
| 5,023,442 A * | 6/1991 | Taniguchi | ................ | B41J 2/451 250/208.1 |
| 5,270,859 A * | 12/1993 | Wirth | .................. | G02B 3/0062 359/419 |
| 5,444,520 A * | 8/1995 | Murano | .................... | B41J 2/465 347/244 |
| 5,581,379 A * | 12/1996 | Aoyama | .............. | G02B 3/0018 349/5 |
| 6,803,939 B2 * | 10/2004 | Shimizu | .................. | B41J 2/451 347/130 |
| 6,849,915 B1 * | 2/2005 | Tsai | .................... | H01L 31/0203 257/432 |

(Continued)

*Primary Examiner* — Edward Chin
(74) *Attorney, Agent, or Firm* — Lathrop Gage LLP

(57) ABSTRACT

A cover-glass-free array camera with individually light-shielded cameras includes an image sensor array having a plurality of photosensitive pixel arrays formed in a silicon substrate, and a lens array bonded to the silicon substrate, wherein the lens array includes (a) a plurality of imaging objectives respectively registered to the photosensitive pixel arrays to form respective individual cameras therewith, and (b) a first opaque material between each of the imaging objectives to prevent crosstalk between individual cameras.

8 Claims, 10 Drawing Sheets

(56) References Cited

U.S. PATENT DOCUMENTS

| | | | |
|---|---|---|---|
| 8,804,255 B2* | 8/2014 | Duparre | B29D 11/00298 |
| | | | 359/621 |
| 9,627,572 B2* | 4/2017 | Okushiba | G01S 7/4813 |
| 9,711,552 B2* | 7/2017 | Rudmann | H01L 27/14625 |
| 2011/0080487 A1* | 4/2011 | Venkataraman | H04N 5/2253 |
| | | | 348/218.1 |
| 2011/0122308 A1* | 5/2011 | Duparre | H01L 27/14621 |
| | | | 348/340 |
| 2011/0176020 A1* | 7/2011 | Chang | G03B 17/12 |
| | | | 348/222.1 |
| 2012/0057100 A1* | 3/2012 | Masuda | B29C 33/3878 |
| | | | 349/62 |
| 2014/0125810 A1* | 5/2014 | D'Amico | H04N 5/2258 |
| | | | 348/164 |
| 2017/0187933 A1* | 6/2017 | Duparre | H01L 27/14621 |

* cited by examiner

COVER-GLASS-FREE ARRAY CAMERA WITH INDIVIDUALLY LIGHT-SHIELDED CAMERAS

BACKGROUND

Array cameras are used in a variety of applications, the most common being imaging with depth perception. Such depth perception may be used, for example, for generation of stereo imagery (three-dimensional imagery), for retrospective focusing of images on objects within a desired depth range, or for achieving an extended depth of field (achieving good focus over an extended depth range). In imaging with depth perception, images captured by an array camera, having two or more cameras viewing the same scene, provide information about the distance from the array camera to objects in the scene. Thus, whereas a conventional single camera generates two-dimensional images only, such array cameras generate three-dimensional information about the scene. An array camera with two individual cameras configured for imaging with depth perception is generally known as a stereo camera. However, larger arrays may in some cases provide additional benefits. Stereo cameras are used in cars in advanced driver assistance systems, wherein the stereo cameras monitor the distance to nearby objects and alert the driver if a collision is impending. Another common application is machine vision. For example, a robot used to pick and place objects may be assisted by a stereo camera that determines the three-dimensional position of an object, to be picked up by the robot, and provides this information to the robot. Gesture control is emerging as yet another application of imaging with depth perception.

For any given application, the array cameras must comply with requirements to both form factor and cost while also achieving the performance needed for the intended application. For example, the accuracy of the three-dimensional position data provided by a stereo camera relies on accurate registration of imaging objectives to respective image sensors. In addition, the image quality and hence the accuracy of information obtainable from the images may be compromised by crosstalk (light leakage) between individual cameras of the array camera, and it is therefore generally preferred to minimize such crosstalk. Wafer-level manufacturing has proven to be the most cost-effective manufacturing method for conventional single cameras having a small form factor.

SUMMARY

In an embodiment, a cover-glass-free array camera with individually light-shielded cameras includes an image sensor array and a lens array. The image sensor array includes a plurality of photosensitive pixel arrays formed in a silicon substrate. The lens array is bonded to the silicon substrate. The lens array includes (a) a plurality of imaging objectives respectively registered to the photosensitive pixel arrays to form respective individual cameras therewith, and (b) a first opaque material between each of the imaging objectives to prevent crosstalk between individual cameras.

In an embodiment, a method for manufacturing a cover-glass-free array camera with individually shielded cameras includes making cuts in a lens wafer including a plurality of imaging objectives, wherein the cuts extend only partway through the lens wafer from the light-receiving side of the lens wafer. The method further includes filling the cuts with opaque material and dicing the lens wafer along dicing lines coinciding with position of some of the cuts, to form a plurality of lens arrays each including an array of the imaging objectives. Each of the imaging objectives in each of the arrays is radially surrounded by a portion of the opaque material. In addition, the method includes bonding each of the lens arrays to silicon substrate of a respective image sensor array to form a cover-glass-free array camera with individually light-shielded cameras.

In an embodiment, a lens array with individually light-shielded imaging objectives includes an optical layer including a plurality of imaging objectives, a spacer layer bonded to side of the optical layer opposite light-receiving end of the imaging objectives, and a first opaque material radially surrounding each of the imaging objectives. The first opaque material extends through the full thickness of the optical layer in dimension parallel to optical axes of the imaging objectives and continues partway through the spacer layer.

DETAILED DESCRIPTION OF THE EMBODIMENTS

Figure 1:
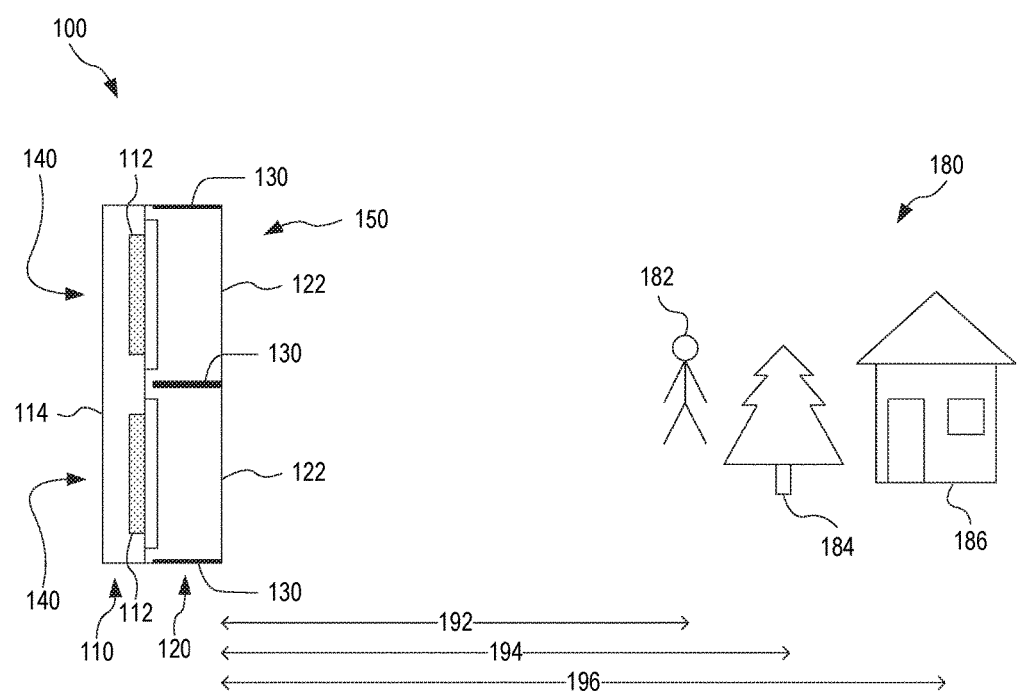
FIG. 1 illustrates a cover-glass-free array camera with individually light-shielded cameras, according to an embodiment.

FIG. 1 illustrates one exemplary cover-glass-free array camera 100 with individually light-shielded cameras 140. Array camera 100 includes an image sensor array 110 and a lens array 120. Image sensor array 110 includes a silicon substrate 114 and a plurality of photosensitive pixel arrays 112. Each photosensitive pixel array 112 is formed in silicon substrate 114 and optionally on silicon substrate 114. For example, each pixel array 112 may include components deposited on silicon substrate 114, such as microlenses and a color filter array (not explicitly shown in FIG. 1). In an embodiment, each pixel array 112 is formed in silicon substrate 114 as a complementary metal-oxide semiconductor (CMOS) image sensor. Lens array 120 includes a plurality of imaging objectives 122. Each imaging objective 122 may include one or more lenses as well as one or more substrates and/or other optical components such as a filter and/or an aperture. Lens array 120 is bonded to silicon substrate 114 such that each imaging objective 122 is registered to a respective pixel array 112 to form a respective individual camera 140. There is no intervening cover-glass between silicon substrate 114 and lens array 120. In each individual camera 140, imaging objective 122 is configured to image a scene onto pixel array 112.

Lens array 120 includes an opaque material 130 that radially surrounds each individual imaging objective 122, i.e., opaque material 130 completes a path around the optical axis of each individual imaging objective 122, wherein the path does not enclose other imaging objectives 122. The cross section of each imaging objective 122, in a plane orthogonal to the optical axis of imaging objective 122, may be square or rectangular. The portion of opaque material 130 located between adjacent imaging objectives 122 prevents, or at least reduces, light leakage between individual cameras 140. The portion of opaque material 130 located on external surfaces of lens array 120 prevents, or at least reduces, undesirable light leakage into array camera 100 from outside array camera 140. Opaque material 130 is substantially opaque to optical radiation within the sensitivity range of pixel arrays 112. Opaque material 130 is black photoresist, for example.

In an embodiment, opaque material 130 extends from the light-receiving side 150 of lens array 120 into lens array 120 but only partway to silicon substrate 114 such that there is a gap between opaque material 130 and silicon substrate 114. This gap serves to maintain the mechanical connection between individual imaging objectives 122 during manufacturing of lens array 120 and assembly of array camera 100. The absence of a cover glass at the interface between silicon substrate 114 and lens array 120 minimizes the gap between opaque material 130 and image sensor array 110 and thus minimizes light leakage between individual cameras 140. Light-receiving side 150 is the side of lens array 120 associated with the light-receiving end of imaging objectives 122 when array camera 100 is imaging a scene.

FIG. 1 shows array camera 100 in one exemplary use scenario, wherein each individual camera 140 is viewing essentially the same scene 180 to capture image(s) of scene 180 and to allow determination of the distance to one or more objects in scene 180. For example, array camera 100 may utilize the depth perception to determine distances 192, 194, and 196 to respective exemplary objects 182, 184, and 186 in scene 180.

Array camera 100 may be manufactured, at least in part, at the wafer-level. For example, a plurality of lens arrays 120 may be formed in a single lens wafer and subsequently singulated therefrom by dicing the lens wafer. Likewise, a plurality of image sensor arrays 110 may be formed in a single image sensor wafer and subsequently singulated therefrom by dicing the image sensor wafer. Array camera 100 may thereby benefit from several advantages of wafer-level manufacturing. One such benefit is improved registration accuracy. Wafer-level manufacturing of each of lens array 120 and image sensor array 110 allows for coupling lens array 120 to image sensor array 110 with only a single registration required. In contrast, if bonding a plurality of separately formed imaging objectives to a respective plurality of separately formed image sensors, each imaging objective-image sensor pair must be individually registered, which leads to an increased risk of registration error. Another benefit is reduced size and cost, as compared to array cameras based on coupling together individual cameras.

The positioning of opaque material 130 integrated with lens array 120, as shown in FIG. 1, allows for wafer-level based manufacture of array camera 100 while achieving (a) low (if any) light-leakage crosstalk between individual cameras 140 and (b) improved registration accuracy over non-wafer-level based array cameras. Thus, array camera 100 may benefit from the reduced cost, size, and registration error associated with wafer-level based manufacturing while also achieving low-crosstalk imaging.

In one embodiment, array camera 100 includes a one-dimensional array of individual cameras 140 with N cameras 140 arranged along a single row, wherein N is an integer greater than one. In one example, array camera 100 includes two or three cameras 140. In another embodiment, array camera 100 includes a two-dimensional array of individual cameras 140 with N cameras in each of M rows, wherein M is an integer greater than one. In one example, array camera 100 includes a rectangular N×M array of individual cameras 140, such as a 2×2 array or a 4×4 array.

Without departing from the scope hereof, lens array 120 may be a stand-alone item configured to cooperate with a third-party image sensor array 110.

Figure 2A:
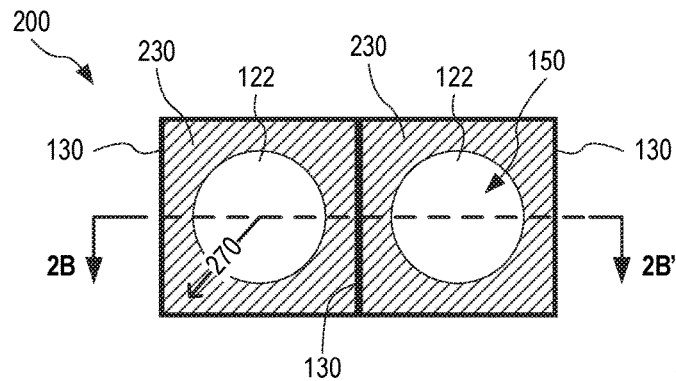
FIGS. 2A and 2B illustrate a one-dimensional cover-glass-free array camera with individually light-shielded, cameras according to an embodiment.
Figure 2B:
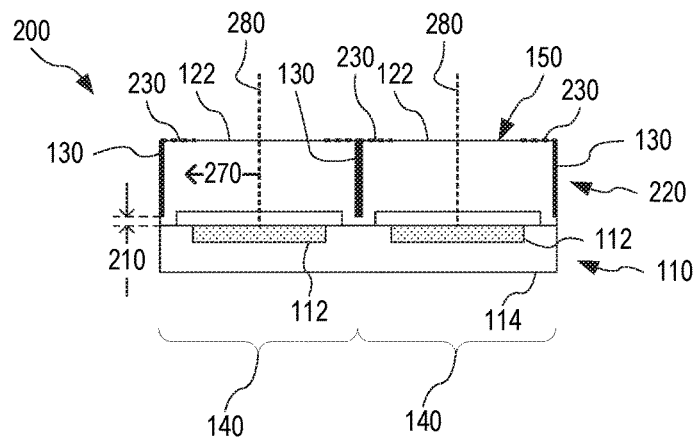

FIGS. 2A and 2B illustrate one exemplary one-dimensional cover-glass-free array camera 200 with individually light-shielded cameras 140. Array camera 200 is a one-dimensional embodiment of array camera 100. FIG. 2A is a top plan view of light-receiving side 150 of array camera 200. FIG. 2B is a cross-sectional view of array camera 200 with the cross section being in the plane including optical axes 280 of imaging objectives 122. FIGS. 2A and 2B are best viewed together. Although, FIGS. 2A and 2B show array camera 200 as including only two individual cameras 140, array camera 200 may include more than two individual cameras arranged along a common row, without departing from the scope hereof.

Array camera 200 includes image sensor array 110 and a lens array 220 bonded with image sensor array 110. Lens array 220 is an embodiment of lens array 120. Array camera 200 implements (a) image sensor array 110 with a one-dimensional array of pixel arrays 112 and (b) lens array 220 with a corresponding one-dimensional array of imaging objectives 122.

In array camera 200, opaque material 130 extends from light-receiving side 150 partway through lens array 220 to a distance 210 away from silicon substrate 114. In an embodiment, distance 210 is no more than 100 microns to ensure no, or only insignificant, light leakage between individual cameras 140. In this embodiment, distance 210 may be no less than 75 microns to ensure structural integrity of lens array 220 prior to bonding with silicon substrate 114.

Opaque material 130 radially surrounds each imaging objective 122. An exemplary radial direction 270 away from optical axis 280 is indicated in FIGS. 2A and 2B. At distances away from silicon substrate exceeding distance 210, opaque coating is present at all radial directions 270 within the full 360 degree angular range.

In an embodiment, lens array 220 includes an opaque coating 230 on light receiving side 150. Opaque coating 230 forms an aperture above each imaging objective 122, which is configured to receive light into the associated individual camera 140 for proper propagation through imaging objective 122. Opaque coating 230 is for example formed from black photoresist or another polymer, or from chromium or another metallic layer.

Figure 3:
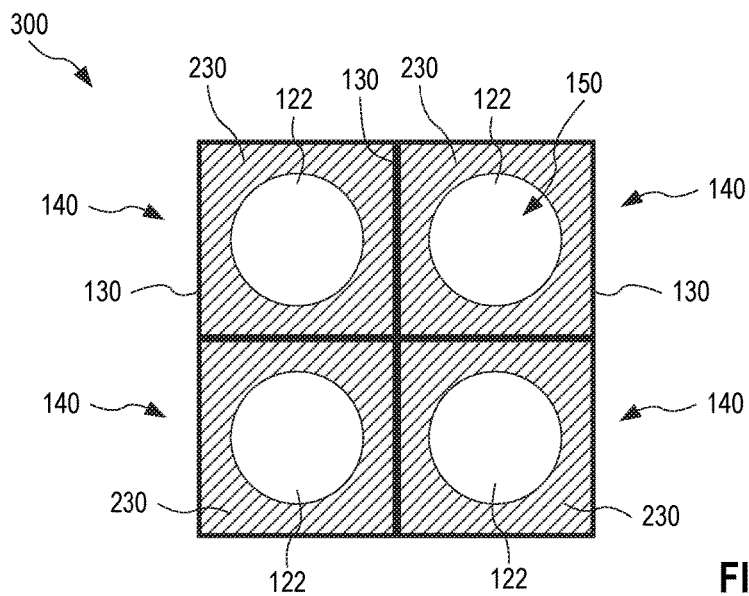
FIG. 3 illustrates a two-dimensional cover-glass-free array camera with individually light-shielded cameras, according to an embodiment.

FIG. 3 illustrates one exemplary two-dimensional cover-glass-free array camera 300 with individually light-shielded cameras 140. Array camera 300 is a two-dimensional embodiment of array camera 100. FIG. 3 is a top plan view of light-receiving side 150 of array camera 300. Array camera 300 is an extension of array camera 200 to a two-dimensional array. Although, FIG. 3 shows array camera 300 as including only four individual cameras 140, array camera 300 may include more than four individual cameras, without departing from the scope hereof. In general, array camera may include N×M individual cameras 140, wherein each of N and M is an integer greater than two. Array camera 300 includes image sensor array 110 and lens array 220 bonded with image sensor array 110. Array camera 300 implements (a) image sensor array 110 with a two-dimensional array of pixel arrays 112 and (b) lens array 220 with a corresponding two-dimensional array of imaging objectives 122.

Figure 4:
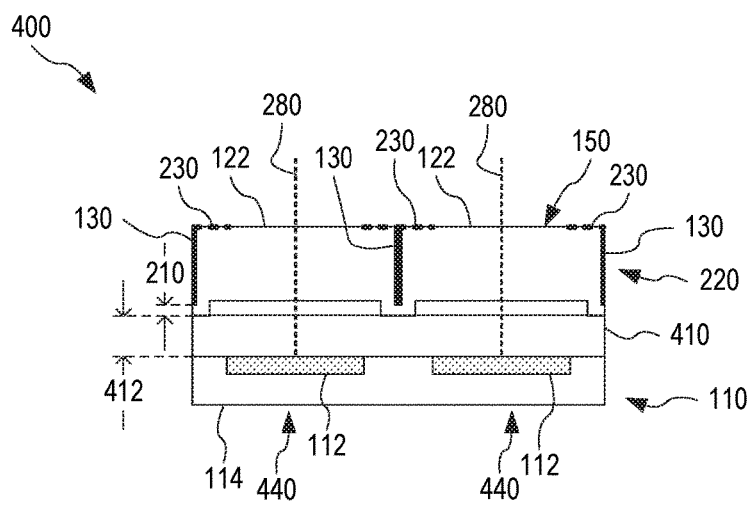
FIG. 4 shows an exemplary array camera that includes a cover glass.

FIG. 4 shows an array camera 400 that includes a cover glass 410. Array camera 400 is similar to array camera 200 and 300 apart from further including cover glass 410 between image sensor array 110 and lens array 220. Cover glass 410 has thickness 412 in dimension parallel to optical axes 280. Due to the presence of cover glass 410, the distance from opaque material 130 to silicon substrate 114 is the sum of thickness 412 and distance 210. Cover glass 410 is light-transmissive and thickness 412 is typically about 1 millimeter, which results in significant light leakage between individual cameras 440 of array camera 400. This illustrates the benefit of a cover-glass-free array camera such as array cameras 100, 200, and 300.

Figure 5:
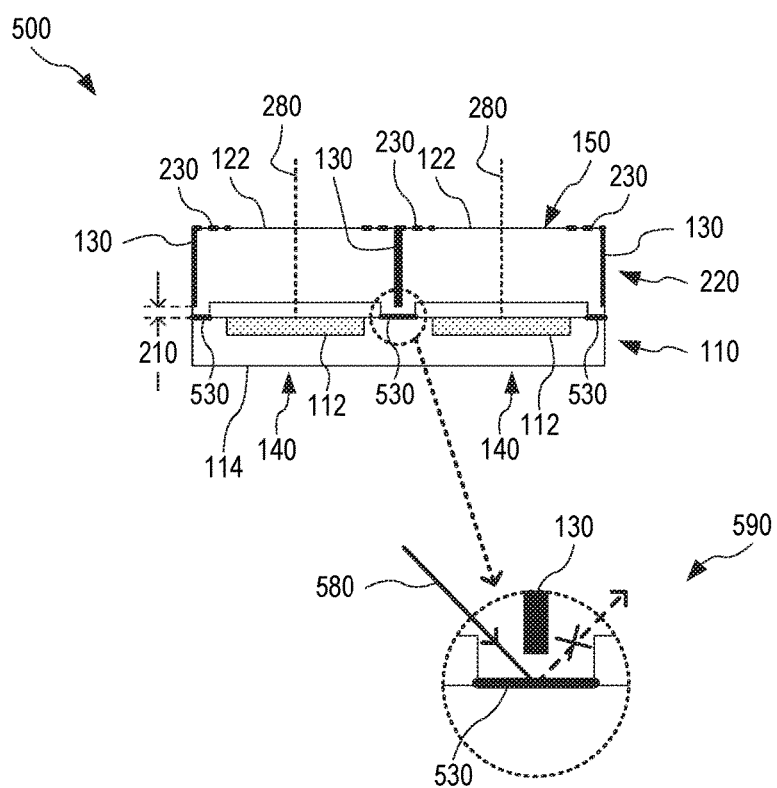
FIG. 5 illustrates a cover-glass-free array camera with individually light-shielded cameras, which includes an opaque layer at the interface between the lens array and the image sensor array, according to an embodiment.

FIG. 5 illustrates one exemplary cover-glass-free array camera 500 with individually light-shielded cameras 140, which includes an opaque layer at the interface between the lens array and the image sensor array. Array camera 500 is an embodiment of either one of array cameras 200 and 300, which further includes an opaque layer 530 at the interface between silicon substrate 114 and lens array 220. Opaque layer 530 may span the entire contact interface between silicon substrate 114 and lens array 220. As shown in close-up 590, opaque layer 530 reduces or eliminates light leakage between individual cameras 140 through the gap between opaque material 130 and silicon substrate 114. Light 580 propagating from one camera 140 toward silicon substrate 114 near the gap between opaque material 130 and silicon substrate 114 is substantially absorbed by opaque layer 530, as opposed to being reflected into the adjacent camera 140.

In one embodiment, opaque layer 530 is a black photoresist or another coating. In another embodiment, opaque layer 530 is a non-transparent spacer such as a silicon spacer.

Figure 6:
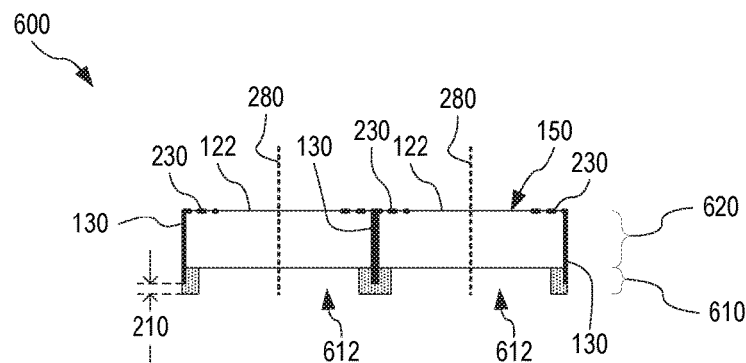
FIG. 6 illustrates a composite lens array with individually light-shielded imaging objectives, according to an embodiment.

FIG. 6 illustrates one exemplary composite lens array 600 with individually light-shielded imaging objectives 122. Lens array 600 is an embodiment of lens array 220. Lens array 600 may include a one-dimensional or a two-dimensional array of imaging objectives 122. Lens array 600 includes an optical layer 620 implementing imaging objectives 122. Lens array 600 further includes a spacer layer 610 bonded to the side of optical layer 620 opposite light-receiving side 150. Spacer layer 610 includes a plurality of apertures 612, respectively registered to imaging objectives 122, for allowing light propagation from imaging objectives 122 to respective pixel arrays 112. When lens array 600 is implemented in array camera 100, spacer layer 610 is bonded to silicon substrate 114. The thickness of spacer layer 610 exceeds distance 210 such that opaque material 130 extends into spacer layer 610 from optical layer 620.

In an embodiment, optical layer 620 includes opaque coating 230 on light-receiving side 150 of optical layer 620.

Figure 7:
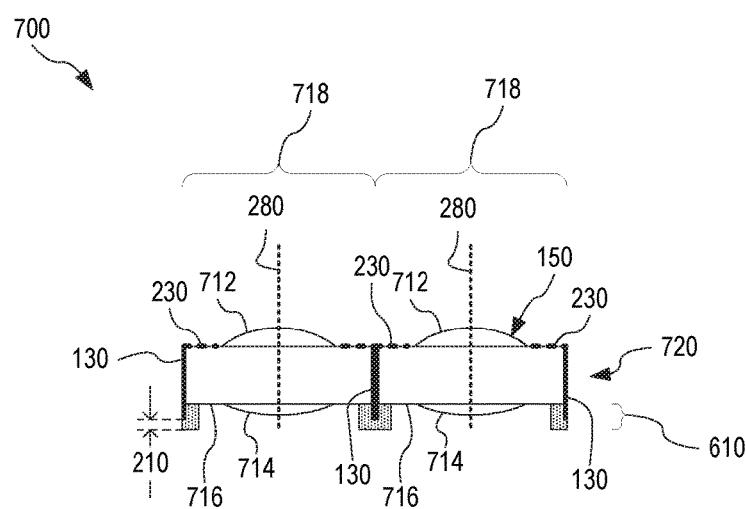
FIG. 7 illustrates a composite lens array with individually light-shielded imaging objectives implemented as wafer-level lenses, according to an embodiment.

FIG. 7 illustrates one exemplary composite lens array 700 with individually light-shielded imaging objectives 122 implemented as wafer-level lenses. Lens array 700 is an embodiment of lens array 600. Lens array 700 may include a one-dimensional or a two-dimensional array of wafer-level lenses. Lens array 700 includes an array of wafer-level lenses 718. Each wafer-level lens includes two lens elements 712 and 714 bonded to opposite sides of a substrate 716. Each wafer-level lens 718 is an embodiment of imaging objective 122.

Without departing from the scope hereof, wafer-level lens 718 may be implemented without lens element 712. Also without departing from the scope hereof, lens array 700 may implement each imaging objective 122 as a stacked wafer-level lens including two or more layers of wafer-level lenses 718 stacked on each other along optical axis 280 and with intermediate spacer(s) between each wafer-level lens 718 in the stack.

Figure 8:
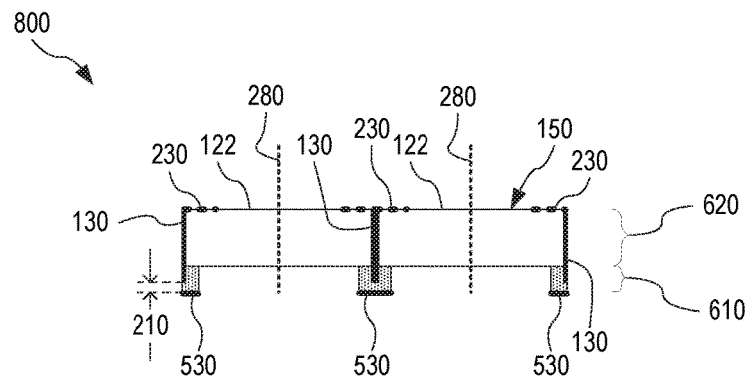
FIG. 8 illustrates a composite lens array with individually light-shielded imaging objectives and an additional opaque layer, according to an embodiment.

FIG. 8 illustrates one exemplary composite lens array 800 with individually light-shielded imaging objectives 122 and an additional opaque layer. Lens array 800 is an embodiment of lens array 600 further including opaque layer 530 disposed on surfaces of spacer layer 610 facing away from optical layer 620. Lens array 800 may include a one-dimensional or a two-dimensional array of imaging objectives 122.

In an embodiment, lens array 800 implements each imaging objective 122 as a wafer-level lens 718 or a stack of wafer-level lenses 718, as discussed above in reference to FIG. 8.

Figure 9:
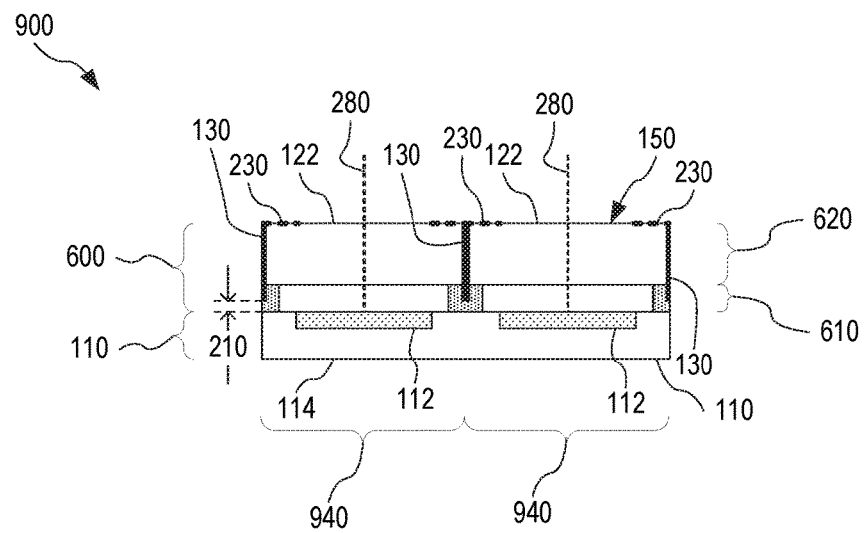
FIG. 9 illustrates a cover-glass-free array camera with individually light-shielded cameras and a composite lens array, according to an embodiment.

FIG. 9 illustrates one exemplary cover-glass-free array camera 900 with individually light-shielded cameras and a composite lens array. Array camera 900 is an embodiment of either one of array cameras 200 and 300, which implements lens array 220 as lens array 600 to form an array of individually light-shielded cameras 940. Each individual camera 940 is an embodiment of camera 140.

Figure 10:
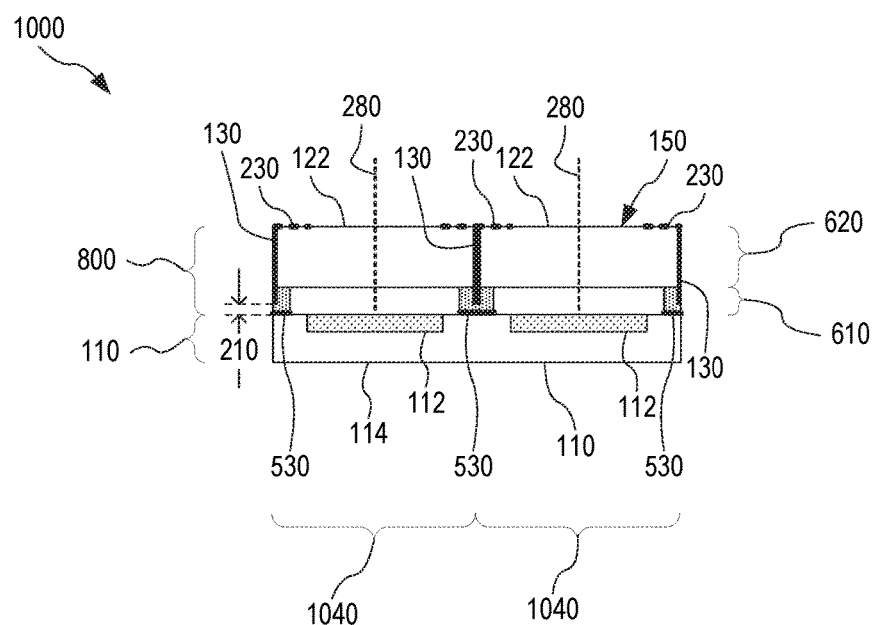
FIG. 10 illustrates a cover-glass-free array camera with individually light-shielded cameras, a composite lens array, and an opaque layer between the lens array and the image sensor array, according to an embodiment.

FIG. 10 illustrates one exemplary cover-glass-free array camera 1000 with individually light-shielded cameras, a composite lens array, and an opaque layer between the lens array and the image sensor array. Array camera 1000 is an embodiment of array camera 500, wherein lens array 800 cooperatively implements lens array 220 and opaque layer 530 of array camera 500. Array camera 1000 includes an array of individually light-shielded cameras 1040. Each individual camera 1040 is an embodiment of camera 140.

Without departing from the scope hereof, opaque layer 530 may be deposited on image sensor array 110 prior to bonding image sensor array 110 to lens array 800.

Figure 11:
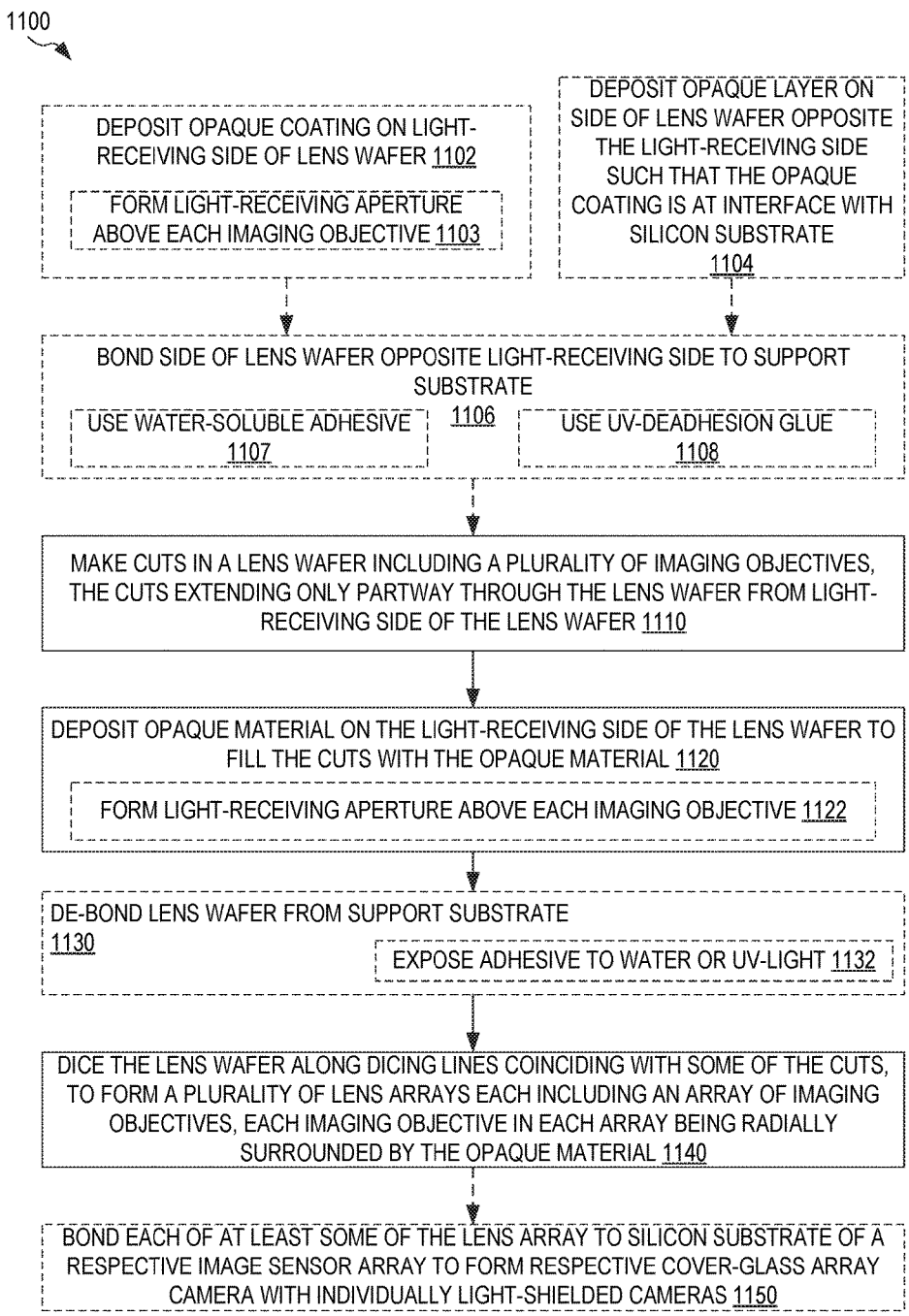
FIG. 11 illustrates a wafer-level based method for manufacturing a plurality of lens arrays with individually light-shielded imaging objectives, according to an embodiment.

FIG. 11 illustrates one exemplary wafer-level based method 1100 for manufacturing a plurality of lens arrays with individually light-shielded imaging objectives. Method 1100 may also form one or more cover-glass-free array cameras with individually light-shielded cameras. Method 1100 may be used to manufacture lens array 120 and, optionally, array camera 100. FIGS. 12A-H illustrate, by example, certain steps of method 1100. FIGS. 11 and 12A-H are best viewed together.

Method 1100 includes a step 1110 of making cuts in a lens wafer that includes a plurality of imaging objectives. The lens wafer may be a composite wafer including several sub-wafers stacked on each other. The cuts made in step 1110 extend only partway through the lens wafer from the light-receiving side of the lens wafer. The light-receiving side of the lens wafer is the side associated with the light-receiving end of the imaging objectives. Step 1110 may utilize a dicing saw to make the cuts.

In certain embodiments, step 1110 is preceded by a step 1106 of bonding side of the lens wafer, opposite the light-receiving side, to a support substrate. This support substrate may serve to help avoid breakage of the lens wafer during or after making the cuts in step 1110. In one embodiment, step 1106 includes a step 1107 of using water-soluble glue to bond the lens wafer to the support substrate, such that the lens wafer may be de-bonded from the support substrate in a later step of method 1100. In another embodiment, step 1106 includes a step 1108 of using ultraviolet-light de-adhesive glue to bond the lens wafer to the support substrate. Step 1108 also allows for subsequent de-bonding of the lens wafer from the support substrate.

Optionally, step 1106 is preceded by one or both of steps 1102 and 1104. Step 1102 deposits an opaque coating on the light-receiving side of the lens wafer. Step 1102 may implement a step 1103 of forming a light-receiving aperture above each imaging objective of the lens wafer. Step 1104 deposits an opaque coating on a side of the lens wafer opposite to the light-receiving side, such that the opaque coating is at an interface with silicon substrate.

Figure 12A:
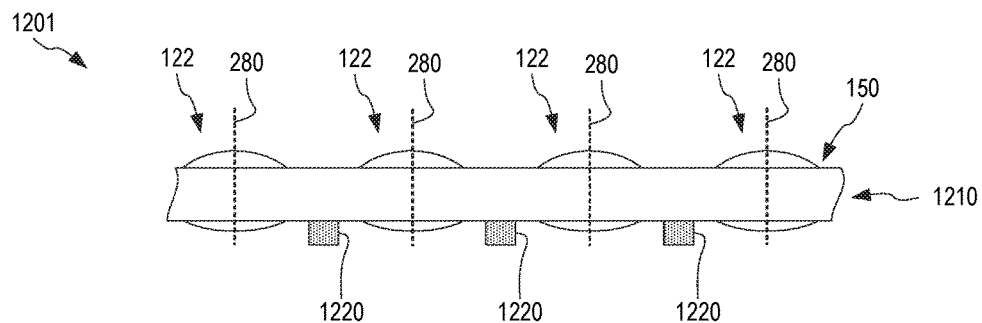
FIGS. 12A-H illustrate certain steps of one embodiment of the method of FIG. 11.

FIG. 12A show, in cross-sectional side view, one exemplary lens wafer 1201 which may be accepted as input to method 1100. Lens wafer 1201 includes an optical sub-wafer 1210 and a spacer sub-wafer 1220. Optical sub-wafer 1210 includes a plurality of imaging objectives 122. These imaging objectives may be wafer-level lenses as shown in FIG. 12A, or be another form of wafer-level imaging objectives without departing from the scope hereof. Spacer sub-wafer 1220 is bonded to the side of optical sub-wafer 1210 opposite the light-receiving side 150 of imaging objectives 122. Material portions of spacer sub-wafer 1220 are away from the intended light propagation path of light from imaging objectives 122, and spacer sub-wafer 1220 thus forms apertures that are respectively registered to imaging objectives 122.

Figure 12B:
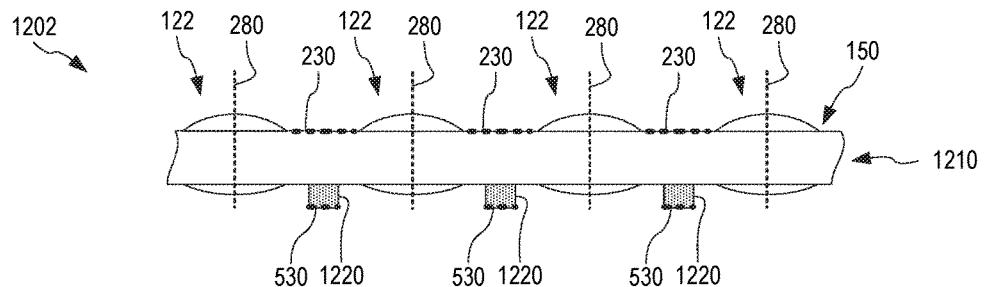

FIG. 12B shows, in cross-sectional side view, one exemplary lens wafer 1202 produced by an embodiment of method 1100, which includes one or both of steps 1102 and 1104. As compared to lens wafer 1201, lens wafer 1202 further includes one or both of opaque coating 230 (formed in step 1102) and opaque layer 530 (formed in step 1104).

Figure 12C:
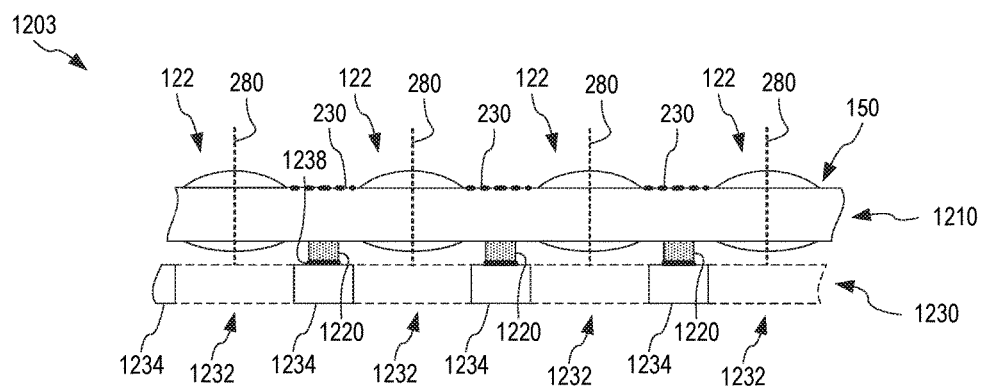

FIG. 12C shows, in cross-sectional side view, one exemplary assembly 1203 formed by step 1106 applied to lens wafer 1201 or lens wafer 1202. Assembly 1203 includes lens wafer 1201 (or lens wafer 1202) and a supportive substrate 1230. In assembly 1203, spacer sub-wafer 1220 is bonded to material portions 1234 of supportive substrate 1230. In one embodiment, supportive substrate 1230 forms apertures 1232 under each imaging objective 122. In another embodiment, supportive substrate 1230 is a continuous substrate with no apertures. Although FIG. 12C does not show opaque layer 530, it is understood that assembly 1203 may include opaque layer 530. Assembly 1203 may include an adhesive 1238 that bonds spacer sub-wafer 1220 to supportive substrate 1230. In one example, step 1106 implements step 1107 and adhesive 1238 is a water-soluble adhesive. In another example, step 1106 implements step 1108 and adhesive 1238 is a ultraviolet-light de-adhesive glue.

Figure 12D:
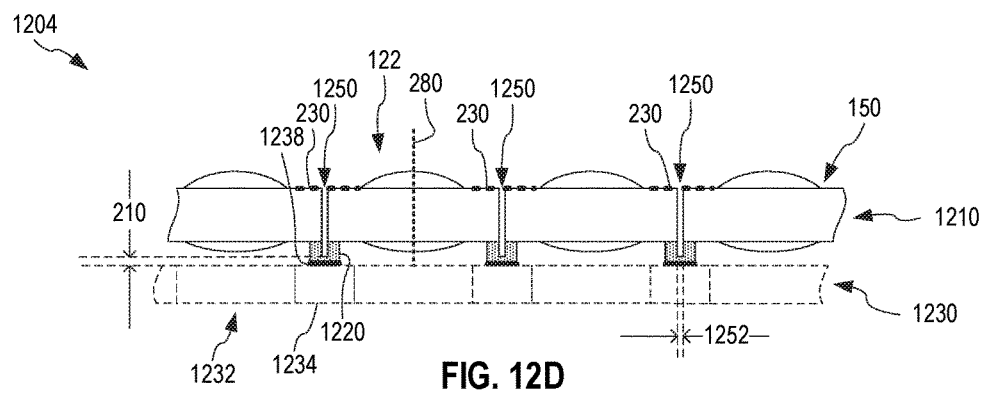
Figure 12E:
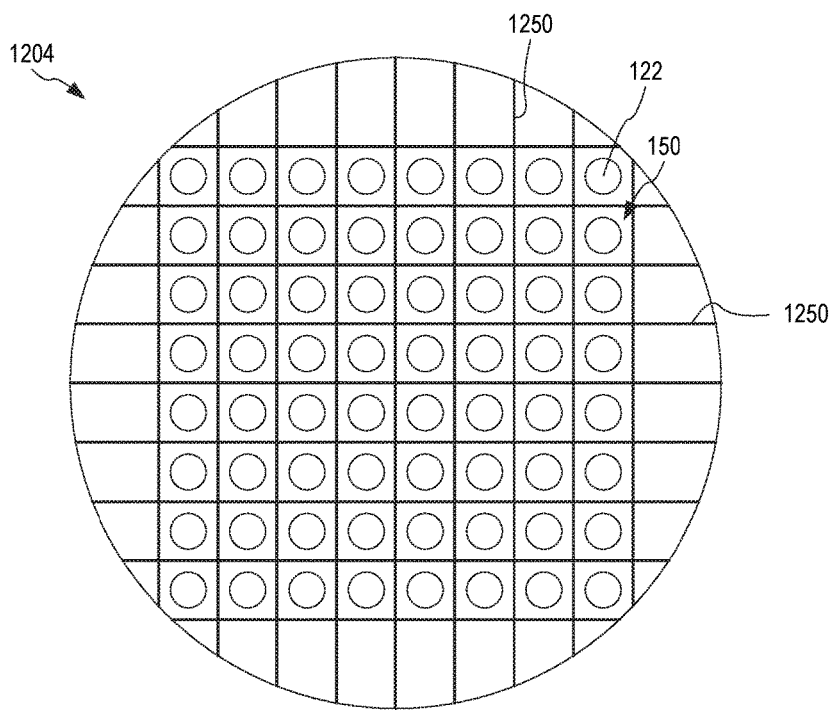

FIG. 12D shows, in cross-sectional side view, one exemplary workpiece 1204 produced when applying step 1110 to any one of lens wafer 1201, lens wafer 1202, or assembly 1203. Workpiece 1204 has cuts 1250 formed in step 1110. FIG. 12E shows the layout of cuts 1250 in top plan view. Cuts 1250 are formed from light-receiving side 150 and extend through the full height of optical sub-wafer 1210 (between imaging objectives 122) and into spacer sub-wafer 1220. However, cuts 1250 extend only partway through spacer sub-wafer 1220 to a distance 210 from the surface of spacer sub-wafer 1220 facing away from optical sub-wafer 1210. Each cut 1250 has a width 1252. Width 1252 is for example greater than 200 micron to allow for spray coating of opaque material 130 into cuts 1250 in a subsequent step of method 1100. In an embodiment, width 1252 is in the range between 200 and 300 microns to allow for spray coating of opaque material 130 into cuts 1250 while also maximizing the number of array cameras produced from workpiece 1204 (as the value of width 1252 increases beyond 300 microns, the distance between imaging objectives 122 may need to be increased accordingly).

In step 1120 of method 1100, opaque material is deposited on the light-receiving side of the lens wafer to fill the cuts, made in step 1110, with the opaque material. In an embodiment, step 1120 includes a step 1122 of forming a light-receiving aperture on the light-receiving side above each imaging objective of the lens wafer. Step 1120 may utilize photolithography, wherein opaque material is deposited on the light-receiving side of the lens wafer and subsequently exposed to patterned light to cure the opaque material in the cuts.

Figure 12F:
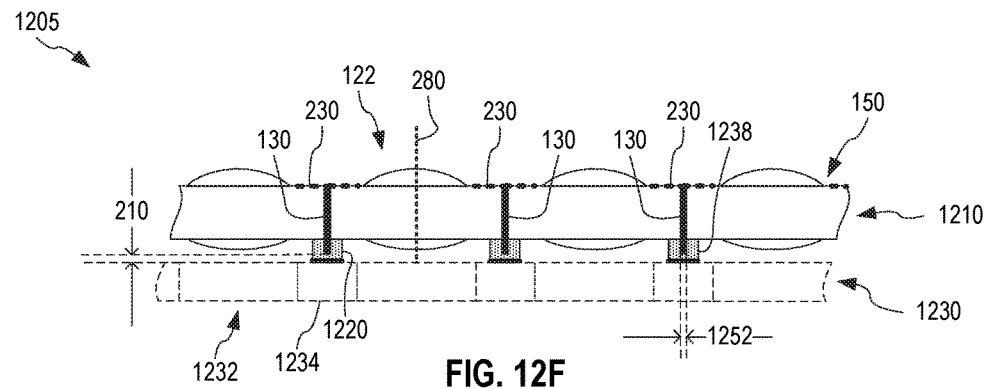

FIG. 12F shows one exemplary workpiece 1205 produced when applying step 1120 to workpiece 1204. In workpiece 1205, opaque material 130 fills cuts 1250. Optionally, in embodiments of step 1120 including step 1122, the opaque material 130 deposited in step 1120 may further form opaque coating 230.

Embodiments of method 1100, which include step 1106, may also include a step 1130 of de-bonding the lens wafer from the supportive substrate after performing steps 1110 and 1120. Without departing from the scope hereof, step 1130 may be performed between steps 1110 and 1120. In an embodiment, step 1130 includes a step 1132 of exposing an adhesive used in step 1107 or in step 1108 to water or ultraviolet light, respectively. In one example of step 1130 implementing step 1132, adhesive 1238 is exposed to water or ultraviolet light to de-bond supportive substrate 1230 from spacer sub-wafer 1220.

In a step 1140, method 1100 dices the lens wafer along dicing lines that coincide with some of the cuts made in step 1110. Step 1140 thus forms a plurality of lens arrays with individually light-shielded imaging objectives. These lens arrays may be one-dimensional or two-dimensional lens arrays. In each such lens array, each imaging objective is radially surrounded by the opaque material deposited in step 1120. Step 1140 may utilize a dicing saw to dice the lens wafer. This dicing saw is thinner than the width of the cuts made in step 1110, such that a portion of the opaque material remains as a coating on the sides of the imaging objectives.

Figure 12G:
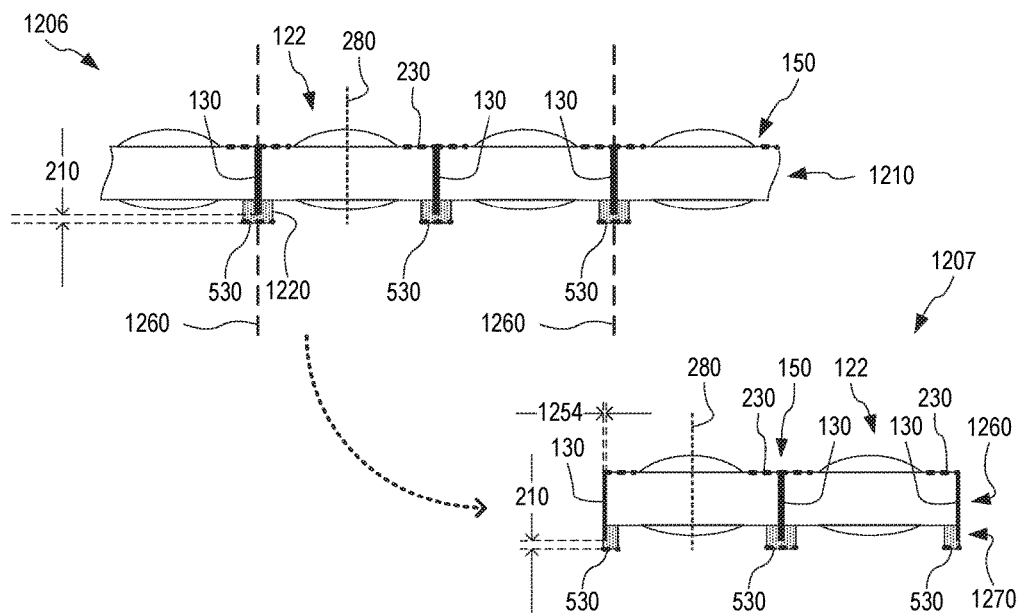

FIG. 12G illustrates step 1140 applied to one exemplary workpiece 1206. Workpiece 1206 is workpiece 1205 without optional supportive substrate 1230. Step 1140 dices workpiece 1206 along dicing lines 1260 to form a plurality of lens arrays 1207. Lens array 1207 is an embodiment of any one of lens arrays 120, 220, 600, 700, and 800. Lens array 1207 includes an optical layer 1270 and a spacer layer 1280. Optical layer 1270 is a portion of optical sub-wafer 1210, and spacer layer 1280 is a portion of spacer sub-wafer 1220. Each imaging objective 122 of lens array 1207 is radially surrounded by opaque material 130. Lens array 1207 may include one or both of opaque coating 230 and opaque layer 530. Sides of imaging objectives 122 abutting a dicing line 1260 maintain a layer of opaque material 130 of width 1254. Width 1254 is less than width 1252. In one embodiment, width 1254 is about 25 microns, for example in the range from 15 to 40 microns. In one example, step 1140 utilizes a dicing blade with a width that is 100 microns less than width 1252. With a common dicing tolerance of 25 microns to each side of the blade, this example would result in a width 1254 of at least 25 microns. In one embodiment, step 1140 utilizes a dicing blade with a width in the range between 100 and 200 microns.

Method 1100 may include a step 1150 of bonding each of at least some of the lens arrays, produced in step 1140, to a silicon substrate of a respective cover-glass-free image sensor array to form a respective cover-glass-free array camera with individually light-shielded cameras. In an embodiment, each lens array is bonded to the respective silicon substrate using an opaque glue.

Figure 12H:
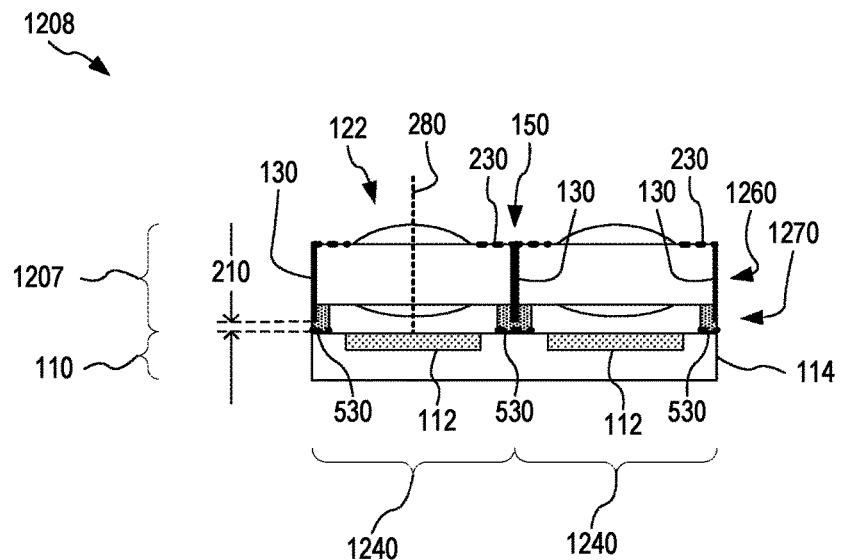

FIG. 12H shows one exemplary cover-glass-free array camera 1208 with individually light-shielded cameras 1240, produced by step 1150 of method 1100 when applied to lens array 1207. Array camera 1208 is an embodiment of any one of array cameras 100, 200, 400, 500, 900, and 1000. Array camera 1208 includes lens array 1207 and image sensor array 110, wherein lens array 1207 is bonded to silicon substrate 114 to form individually light-shielded cameras 1240.

Without departing from the scope hereof, optical sub-wafer 1210 and spacer sub-wafer 1220 of lens wafer 1201 may be integrally formed, such that optical layer 1270 and spacer layer 1280 of array camera 1300 are integrally formed. Also without departing from the scope hereof, optional step 1104 may be performed later in method 1100, for example after step 1130.

Although not illustrated in FIGS. 11 and 12A-H, method 1100 may include an additional step of sorting the lens arrays produced in step 1140 according to a performance-related property, such as a property related to the modulation transfer function of the lens arrays.

Figure 13:
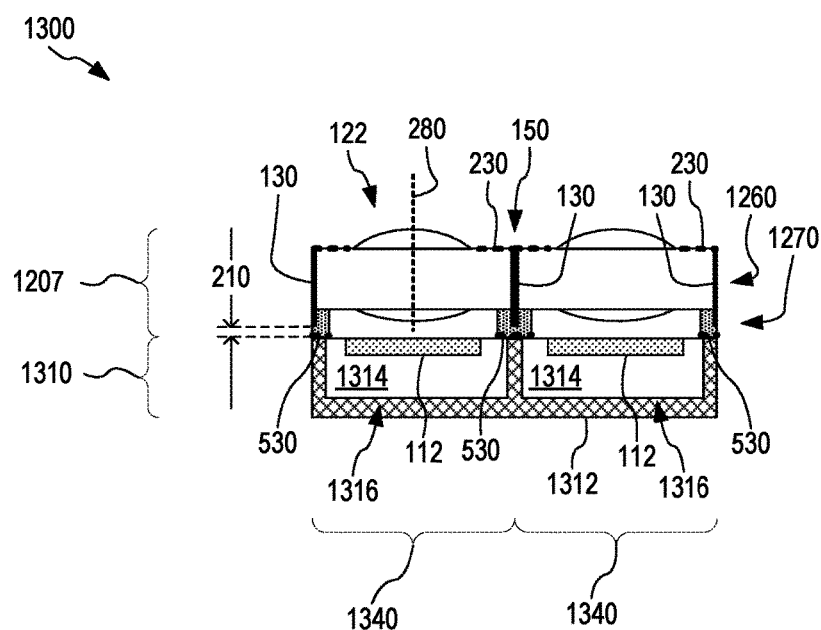
FIG. 13 illustrates a cover-glass-free array camera with individually light-shielded cameras, which is based on a packaged image sensor array, according to an embodiment.

FIG. 13 illustrates one exemplary cover-glass-free array camera 1300 with individually light-shielded cameras, which is based on a packaged image sensor array. Array camera 1300 is an extension of array camera 1208, wherein image sensor array 110 is replaced by a packaged image sensor array 1310. Packaged image sensor array includes a plurality of separate cover-glass-free image sensors 1316 packaged together in a housing 1312. Each image sensor 1316 includes a respective pixel array 112 formed in/on a respective silicon substrate 1314. Spacer layer 1280 is bonded to housing 1312 and/or silicon substrates 1314, such that each imaging objective 122 cooperates with a respective image sensor 1316 to form a respective individually light-shielded camera 1340.

Without departing from the scope hereof, optical layer 1270 and spacer layer 1280 of array camera 1300 may be integrally formed.

Packaged mage sensor array 1310 may replace image sensor array 110 through the present disclosure, without departing from the scope hereof.

Combinations of Features

Features described above as well as those claimed below may be combined in various ways without departing from the scope hereof. For example, it will be appreciated that aspects of one cover-glass-free array camera with individually light-shielded cameras, or an associated method or lens array, described herein may incorporate or swap features of another cover-glass-free array camera with individually light-shielded cameras, or associated method or lens array described herein. The following examples illustrate possible, non-limiting combinations of embodiments described above. It should be clear that many other changes and modifications may be made to the methods and device herein without departing from the spirit and scope of this invention:

(A1) A cover-glass-free array camera with individually light-shielded cameras may include an image sensor array including a plurality of photosensitive pixel arrays formed in a silicon substrate, and a lens array bonded to the silicon substrate, wherein the lens array includes (a) a plurality of imaging objectives respectively registered to the photosensitive pixel arrays to form respective individual cameras therewith, and (b) a first opaque material between each of the imaging objectives to prevent crosstalk between individual cameras.

(A2) In the cover-glass-free array camera denoted as (A1), the lens array may be bonded to the silicon substrate with no cover glass disposed therebetween.

(A3) In either or both of the cover-glass-free array cameras denoted as (A1) and (A2), the first opaque material may extend only partway through the lens array from light-receiving surface of the lens array to a non-zero distance away from the silicon substrate.

(A4) In the cover-glass-free array camera denoted as (A3), the distance may be less than 100 microns.

(A5) In any of the cover-glass-free array cameras denoted as (A1) through (A4), the lens array may include an optical layer including the imaging objectives, and a spacer layer having a first side bonded to the optical layer and a second side bonded to the silicon substrate, wherein the first side and the second side are opposite facing.

(A6) In the cover-glass-free array camera denoted as (A5), the first opaque material may extend through full height of the optical layer and partway through the spacer layer from the first side, in dimension orthogonal to the first side, to a non-zero distance away from the silicon substrate.

(A7) In the cover-glass-free array camera denoted as (A6), the non-zero distance may be less than 100 microns.

(A8) In either or both of the cover-glass-free array cameras denoted as (A6) and (A7), the non-zero distance may be at least 75 microns.

(A9) Any of the cover-glass-free array cameras denoted as (A6) through (A8) may further include a second opaque material at the interface between the spacer layer and the silicon substrate.

(A10) In any of the cover-glass-free array cameras denoted as (A1) through (A9), the first opaque material may radially surround each of the imaging objectives.

(A11) The cover-glass-free array camera denoted as (A10) may further include a third opaque material extending across portion of surface of the imaging objectives facing away from the silicon substrate and forming an aperture above each of the imaging objectives for accepting light into each of the individual cameras.

(B1) A method for manufacturing a cover-glass-free array camera with individually shielded cameras may include (a) making cuts in a lens wafer including a plurality of imaging objectives, wherein the cuts extend only partway through the lens wafer from light-receiving side of the lens wafer, (b) filling the cuts with opaque material, and (c) dicing the lens wafer along dicing lines coinciding with position of some of the cuts, to form a plurality of lens arrays each including an array of the imaging objectives, wherein each of the imaging objectives in each of the arrays is radially surrounded by a portion of the opaque material.

(B2) The method denoted as (B1) may further include bonding each of the lens arrays to the silicon substrate of a respective image sensor array to form a cover-glass-free array camera with individually light-shielded cameras.

(B3) In the method denoted as (B2), the step of bonding may include for each of the lens arrays, bonding the lens array to the silicon substrate using an opaque glue.

(B4) In any of the methods denoted as (B1) through (B3), the lens wafer may include (i) an optical sub-wafer including the imaging objectives and (ii) a spacer sub-wafer having a first side bonded to surface of the optical sub-wafer facing away from the light-receiving side.

(B5) In the method denoted as (B4), the step of making cuts may include cutting into the optical sub-wafer from the first side, through the optical sub-wafer, and partway through the spacer sub-wafer.

(B6) Any of the methods denoted as (B1) through (B5) may further include bonding a support substrate to a second side of the lens wafer opposite the light-receiving side prior to the step of making cuts, and de-bonding the lens wafer from the support substrate after the step of filling.

(B7) The method denoted as (B6) may further include (1) in the step of bonding, bonding the second side to the support substrate using a water-soluble adhesive, and (2) in the step of de-bonding, exposing the water-soluble adhesive to water.

(B8) Either or both of the methods denoted as (B6) and (B7) may further include, prior to the step of bonding, depositing an opaque layer on the second side such that the opaque layer, if the lens array is bonded to an image sensor array to form a cover-glass free array camera, is at interface between the lens array and the image sensor array.

(B9) Any of the methods denoted as (B1) through (B8) may further include depositing an opaque layer on surface of the lens wafer opposite the light-receiving side, such that the opaque layer, if the lens array is bonded to an image sensor array to form a cover-glass free array camera, is at interface between the lens array and the image sensor array.

(B10) In any of the methods denoted as (B1) through (B9), the step of filling may include depositing black photoresist on the light-receiving side to fill the cuts, and lithographically developing the black photoresist to cure the black photoresist in the cuts.

(C1) A lens array with individually light-shielded imaging objectives may include an optical layer including a plurality of imaging objectives, a spacer layer bonded to side of the optical layer opposite light-receiving end of the imaging objectives, and a first opaque material radially surrounding each of the imaging objectives, wherein the first opaque material extends through full thickness of the optical layer, in dimension parallel to optical axes of the imaging objectives, and continues partway through the spacer layer.

(C2) In the lens array denoted as (C1), the first opaque material may extend from surface of the spacer layer bonded to the optical layer to a distance of no more than 100 microns away from surface of the spacer wafer facing away from the optical layer.

(C3) In the lens array denoted as (C2), the distance may be at least 75 microns.

(C4) In any of the lens arrays denoted as (C1) through (C3), the thickness of the first opaque material may be in the range between 200 and 300 microns, in dimension orthogonal to the optical axes.

(C5) In any of the lens arrays denoted as (C1) through (C4), the spacer layer may form a plurality of apertures respectively registered to the plurality of imaging objectives, wherein the lens array further includes a second opaque material on the surface of the spacer layer facing away from the optical layer, and wherein the second opaque coating spans around and between the apertures.

(C6) Any of the lens arrays denoted as (C1) through (C5) may further include a third opaque material, on side of the optical layer associated with the light-receiving end of the imaging objectives and forming a light-receiving aperture above each of the imaging objectives.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and systems, which, as a matter of language, might be said to fall therebetween.

What is claimed is:

1. A cover-glass-free array camera with individually light-shielded cameras, comprising:
    an image sensor array including a plurality of photosensitive pixel arrays formed in a common silicon substrate; and
    a lens array bonded to the silicon substrate with no cover glass therebetween, the lens array including:
        (a) a plurality of imaging objectives respectively registered to the photosensitive pixel arrays to form respective individual cameras therewith, and
        (b) a first opaque material between each of the imaging objectives to prevent crosstalk between individual cameras, the first opaque material extending only partway through the lens array from light-receiving surface of the lens array to a non-zero distance away from the silicon substrate, the non-zero distance being less than 100 microns.

2. The cover-glass-free array camera of claim 1, the lens array comprising:
    an optical layer including; and
    a spacer layer having a first side bonded to the optical layer and a second side bonded to the silicon substrate, the first side and the second side being opposite facing.

3. The cover-glass-free array camera of claim 2, the first opaque material extending through full height of the optical layer and partway through the spacer layer from the first side, in dimension orthogonal to the first side, to a non-zero distance away from the silicon substrate.

4. A cover-glass-free array camera with individually light-shielded cameras, comprising:
    an image sensor array including a plurality of photosensitive pixel arrays formed in a common silicon substrate; and
    a lens array bonded to the silicon substrate, the lens array including:
        (a) an optical layer including a plurality of imaging objectives respectively registered to the photosensitive pixel arrays to form respective individual cameras therewith, (b) a spacer layer having a first side bonded to the optical layer and a second side bonded to the silicon substrate, the first side and the second side being opposite facing, and (c) a first opaque material between each of the imaging objectives to prevent crosstalk between individual cameras, the first opaque material extending through full height of the optical layer and partway through the spacer layer from the first side, in dimension orthogonal to the first side, to a non-zero distance away from the silicon substrate, the non-zero distance being less than 100 microns.

5. The cover-glass-free array camera of claim 4, the non-zero distance being at least 75 microns.

6. The cover-glass-free array camera of claim 3, further including a second opaque material at interface between the spacer layer and the silicon substrate.

7. The cover-glass-free array camera of claim 1, the first opaque material radially surrounding each of the imaging objectives.

8. The cover-glass-free array camera of claim 7, further including a third opaque material extending across portion of surface of the imaging objectives facing away from the silicon substrate and forming an aperture above each of the imaging objectives for accepting light into each of the individual cameras.

* * * * *